(12) United States Patent
Alenin (10) Patent No.: US 7,078,973 B2
(45) Date of Patent: Jul. 18, 2006

(54) BIPOLAR RAIL-TO-RAIL OUTPUT STAGE

(75) Inventor: Sergey Alenin, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 37 days.

(21) Appl. No.: 10/960,182

(22) Filed: Oct. 7, 2004

(65) Prior Publication Data

US 2006/0077008 A1    Apr. 13, 2006

(51) Int. Cl.
*H03F 3/18* (2006.01)

(52) U.S. Cl. .................................... 330/263; 330/267

(58) Field of Classification Search ........ 330/262–264, 330/267, 265–266
See application file for complete search history.

(56) References Cited

U.S. PATENT DOCUMENTS

| | | | |
|---|---|---|---|
| 5,659,266 A * | 8/1997 | Shacter et al. | 330/267 |
| 6,356,061 B1 | 3/2002 | Perillo | 323/274 |
| 6,542,032 B1 | 4/2003 | Escobar-Bowser et al. | 330/255 |
| 6,727,758 B1 | 4/2004 | Govil | 330/264 |

OTHER PUBLICATIONS

Johan H. Huijsing, "Operational Amplifiers. Theory and Design", Kluwer Academic Publishers, Boston, 2001, p. 156-159.
Johan H. Huijsing, "Compact Low-Voltage and High Speed CMOS, BICMOS and Bipolar Operational Amplifiers.", Kluwer Academic Publishers, Boston, 1999, p. 225-227.
Dennis M. Monticelli A Quad CMOS Single-Supply Op Amp with Rail-to-Rail Output Swing:IEEE Journal of Solid-State Circuits, vol. SC-21, No. 6, Dec. 1986.

* cited by examiner

*Primary Examiner*—Robert Pascal
*Assistant Examiner*—Hieu Nguyen
(74) *Attorney, Agent, or Firm*—Alan K. Stewart; W. James Brady, III; Frederick J. Telecky, Jr.

(57) ABSTRACT

A bipolar rail-to-rail class-AB output stage that provides improved AC performance in low voltage applications. The bipolar output stage includes an input buffer stage, first and second complementary common emitter stages, and first and second control circuits biased and configured to assure class-AB operation of the first and second common emitter stages, respectively. The input of the bipolar output stage is applied to the input buffer stage, and the output of the bipolar output stage is provided by the second common emitter stage. The combination of the first common emitter stage and the first AB-control circuit operates as a current booster stage for the second common emitter stage, thereby obviating the need for a large power supply.

14 Claims, 6 Drawing Sheets

BIPOLAR RAIL-TO-RAIL OUTPUT STAGE

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present application relates generally to bipolar output stages, and more specifically to a bipolar rail-to-rail class-AB output stage that provides improved AC performance in low voltage applications.

Figure 1:
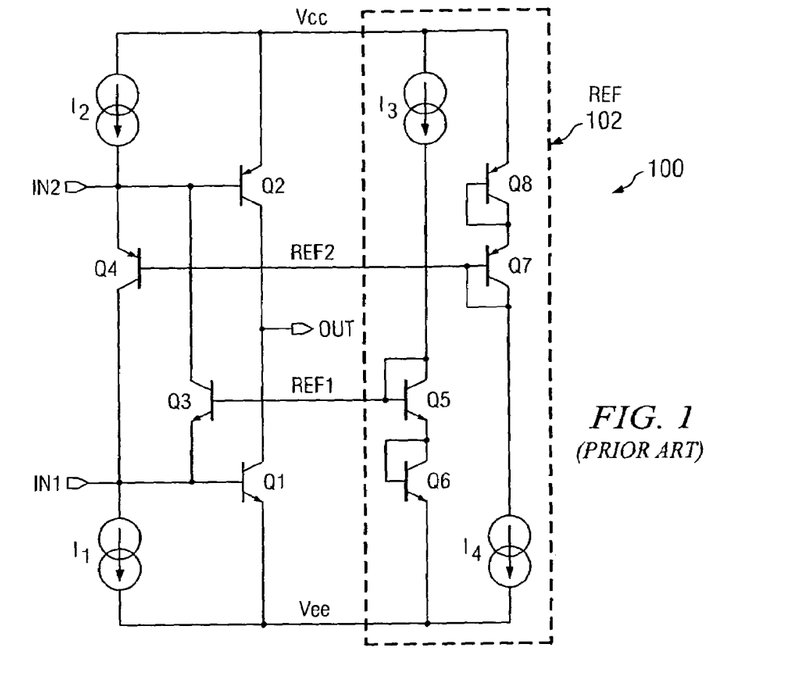
FIG. 1 is a schematic diagram of a first conventional bipolar rail-to-rail class-AB output stage.

Bipolar class-AB output stages are known that are capable of providing a rail-to-rail output swing. For example, FIG. 1 depicts a conventional bipolar rail-to-rail class-AB output stage 100, which includes transistors Q1–Q4, current sources I1–I2, and a reference voltage generator REF 102 including diode-connected transistors Q5–Q8 and current sources I3–I4. As shown in FIG. 1, the inputs IN1–IN2 of the output stage 100 are applied to the bases of the transistors Q1–Q2, respectively, and the output OUT is provided at the collectors of the transistors Q1–Q2. The NPN-type transistor Q1 and the PNP-type transistor Q2 are configured to form a complementary common emitter stage, and the transistors Q3–Q4 are configured to form a control circuit to assure class-AB operation of the output stage. Reference voltages REF1–REF2 are provided to the bases of the transistors Q3–Q4, respectively, the current source 11 is coupled between the collector of the transistor Q4 and the negative power supply voltage Vee, and the current source 12 is coupled between the emitter of the transistor Q4 and the positive power supply voltage Vcc, thereby biasing of the AB-control circuit formed by the transistors Q3–Q4.

One drawback of the above-described bipolar rail-to-rail class-AB output stage 100 is that the NPN and PNP transistors Q1–Q2 forming the complementary common emitter stage typically have a low current gain β. One way of increasing the overall current gain of the output stage 100 is to employ respective Darlington circuits in place of the single NPN and PNP transistors Q1–Q2. For example, such Darlington circuits may provide current gains equal to about $\beta^2$ while providing good AC performance. However, relatively large power supplies are generally required for Darlington circuit configurations, thereby making them unsuitable for low voltage applications. Further, because the current gain β of NPN transistors is generally not equal to the current gain β of PNP transistors, the respective current gains $\beta^2$ of Darlington circuits disposed on the NPN and PNP-sides of the output stage 100 may be significantly different. As a result, positive and negative half-waves provided at the output OUT of the bipolar output stage 100 may be highly unsymmetrical.

Figure 2:
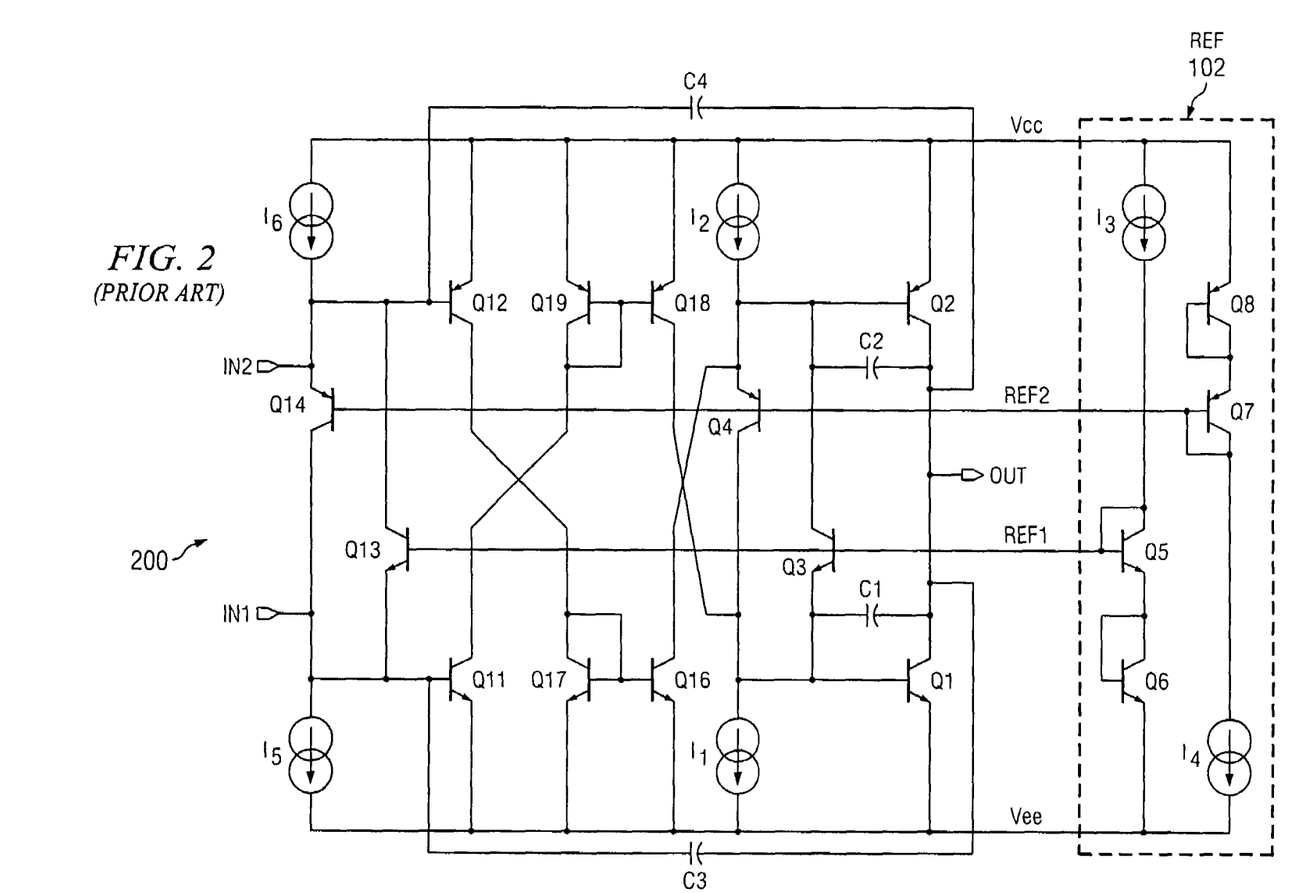
FIG. 2 is a schematic diagram of a second conventional bipolar rail-to-rail class-AB output stage.

FIG. 2 depicts another conventional bipolar rail-to-rail class-AB output stage 200 comprising two cascaded class-AB output stages. The output stage 200 includes the transistors Q1–Q4, the current sources I1–I2, and the reference voltage source REF 102 including the diode-connected transistors Q5–Q8 and the current sources I3–I4. As in the output stage 100 of FIG. 1, the NPN-type transistor Q1 and the PNP-type transistor Q2 are configured to form a first complementary common emitter stage, and the transistors Q3–Q4 are configured to form a first AB-control circuit. The output stage 200 further includes an NPN-type transistor Q1 and a PNP-type transistor Q12 configured to form a second complementary common emitter stage, and transistors Q13–Q14 configured to form a second AB-control circuit. As shown in FIG. 2, the inputs IN1–IN2 of the output stage 200 are applied to the bases of the transistors Q11–Q12, respectively, and the output OUT is provided at the collectors of the transistors Q1–Q2. The reference voltage REF1 is provided to the base of the transistor Q3, the reference voltage REF2 is provided to the base of the transistor Q4, the current source 11 is coupled between the collector of the transistor Q4 and the negative supply voltage Vee, and the current source 12 is coupled between the emitter of the transistor Q4 and the positive supply voltage Vcc, thereby biasing the first AB-control circuit formed by the transistors Q3–Q4. Further, the reference voltage REF1 is provided to the base of the transistor Q13, the reference voltage REF2 is provided to the base of the transistor Q14, a current source 15 is coupled between the collector of the transistor Q14 and the negative supply voltage Vee, and a current source 16 is coupled between the emitter of the transistor Q14 and the positive supply voltage Vcc, thereby biasing the second AB-control circuit formed by the transistors Q13–Q14. The output stage 200 further includes a first current mirror including a diode-connected input transistor Q17 and an output transistor Q16, a second current mirror including a diode-connected input transistor Q19 and an output transistor Q18, capacitors C1–C2 coupled between the output OUT and the input of the first class-AB output stage, and capacitors C3–C4 coupled between the output OUT and the input of the second class-AB output stage, thereby providing frequency compensation by a nested Miller compensation technique.

Although the bipolar rail-to-rail class-AB output stage 200 of FIG. 2 is more suited to low voltage applications than the bipolar output stage 100 of FIG. 1, the output stage 200 also has drawbacks in that the nested Miller compensation technique employed therewith significantly reduces the speed of the circuit. For example, the feedback loop formed by the Miller capacitors C1–C2 and the feedback loop formed by the Miller capacitors C3–C4 each reduce the overall unity gain frequency of the circuit by a factor of about ⅓.

It would therefore be desirable to have an improved bipolar rail-to-rail class-AB output stage that avoids the drawbacks of the above-described conventional bipolar output stages.

BRIEF SUMMARY OF THE INVENTION

In accordance with the present invention, a bipolar rail-to-rail class-AB output stage is disclosed that provides improved AC performance in low voltage applications. In one embodiment, the bipolar rail-to-rail class-AB output stage includes an input buffer stage, first and second complementary common emitter stages, and first and second control circuits biased and configured to assure class-AB operation of the first and second complementary common emitter stages, respectively. The input of the bipolar output stage is applied to the input buffer stage, and the output of the bipolar output stage is provided by the second complementary common emitter stage. The combination of the first complementary common emitter stage and the first AB-control circuit operates as a current booster stage for the second complementary common emitter stage, thereby obviating the need for a large power supply.

In the presently disclosed embodiment, the input buffer stage comprises an NPN-type transistor, and the input of the bipolar output stage is applied to the base of the NPN transistor. The signal path within the bipolar output stage extends from the base of the NPN transistor included in the input buffer stage, through the base-emitter junction of the NPN transistor, and to the base of an NPN-type transistor included in the second complementary common emitter stage. The combination of the respective NPN transistors of the input buffer stage and the second complementary common emitter stage operates like a Darlington common emitter stage. The signal path extends from the emitter of the NPN transistor included in the input buffer stage via the second AB-control circuit (common base NPN/PNP mesh stage) to the base of a PNP-type transistor included in the second complementary common emitter stage. The bipolar output stage is frequency compensated such that a feed-forward capacitor is coupled between the second complementary common emitter stage and the second AB-control circuit to allow the length of the signal path to be reduced during high frequency operation. A respective feed-forward capacitor is also coupled between the first complementary common emitter stage and the first AB-control circuit.

The input buffer stage drives a PNP-type transistor included in the first complementary common emitter stage directly, and drives an NPN-type transistor included in the first complementary common emitter stage via the first AB-control circuit (common base NPN/PNP mesh stage) and via the feed-forward capacitor during high frequency operation. The PNP and NPN transistors of the first complementary common emitter stage in turn drive the NPN and PNP transistors of the second complementary common emitter stage, respectively. As a result, substantially the same total current gain is provided along the respective signal paths extending from the input buffer stage to the NPN and PNP transistors of the second complementary common emitter stage.

Figure 7A:
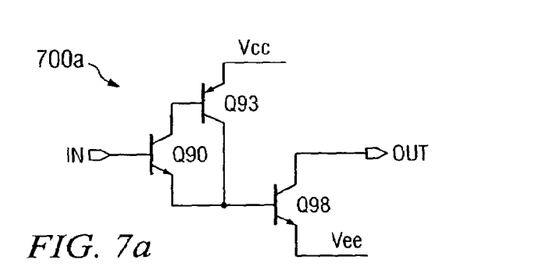
FIGS. 7a–7b are schematic diagrams of AC equivalent circuits corresponding to the bipolar rail-to-rail class-AB output stage of FIG. 3.
Figure 7B:
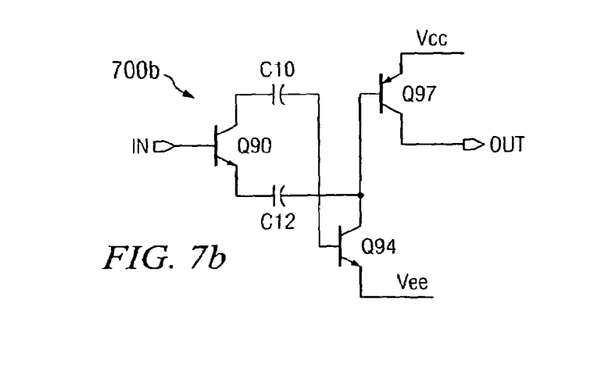

Because the bipolar rail-to-rail class-AB output stage operates like a Darlington common emitter stage at high frequency, the overall current gain of the bipolar output stage is increased and AC performance is improved. FIGS. 7a–7b depict illustrative AC equivalent circuits 700a and 700b corresponding to the bipolar rail-to-rail class-AB output stage. The AC equivalent circuit 700a is configured for sinking current, and the AC equivalent circuit 700b is configured for sourcing current. It is noted that for both polarities, an input buffer NPN-type transistor Q90 and a PNP-type transistor Q93 (see FIG. 7a), or an NPN-type transistor Q94 (see FIG. 7b), included in the first common emitter stage form a current boosted emitter follower with a local feedback loop providing unity voltage gain with maximum speed performance. The current boosted emitter follower drives an output NPN-type transistor Q98 (see FIG. 7a), or an output PNP-type transistor Q97 (see FIG. 7b), included in the second common emitter stage to form the Darlington-type common emitter stage. In this way, high current gain (beta cubed) is achieved and AC performance is improved, as compared to, for example, a multi-gain stage topology with nested Miller compensation.

Further, because the current booster stage obviates the need for a large power supply when the bipolar output stage operates as a Darlington circuit, the bipolar output stage is more suitable for use in low voltage applications. In addition, because substantially the same total current gain is provided along the signal paths from the input buffer stage to the NPN and PNP transistors of the second complementary common emitter stage, positive and negative half-waves provided at the output of the bipolar output stage exhibit increased symmetry.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

A bipolar rail-to-rail class-AB output stage is provided that exhibits improved AC performance in low voltage applications.

Figure 3:
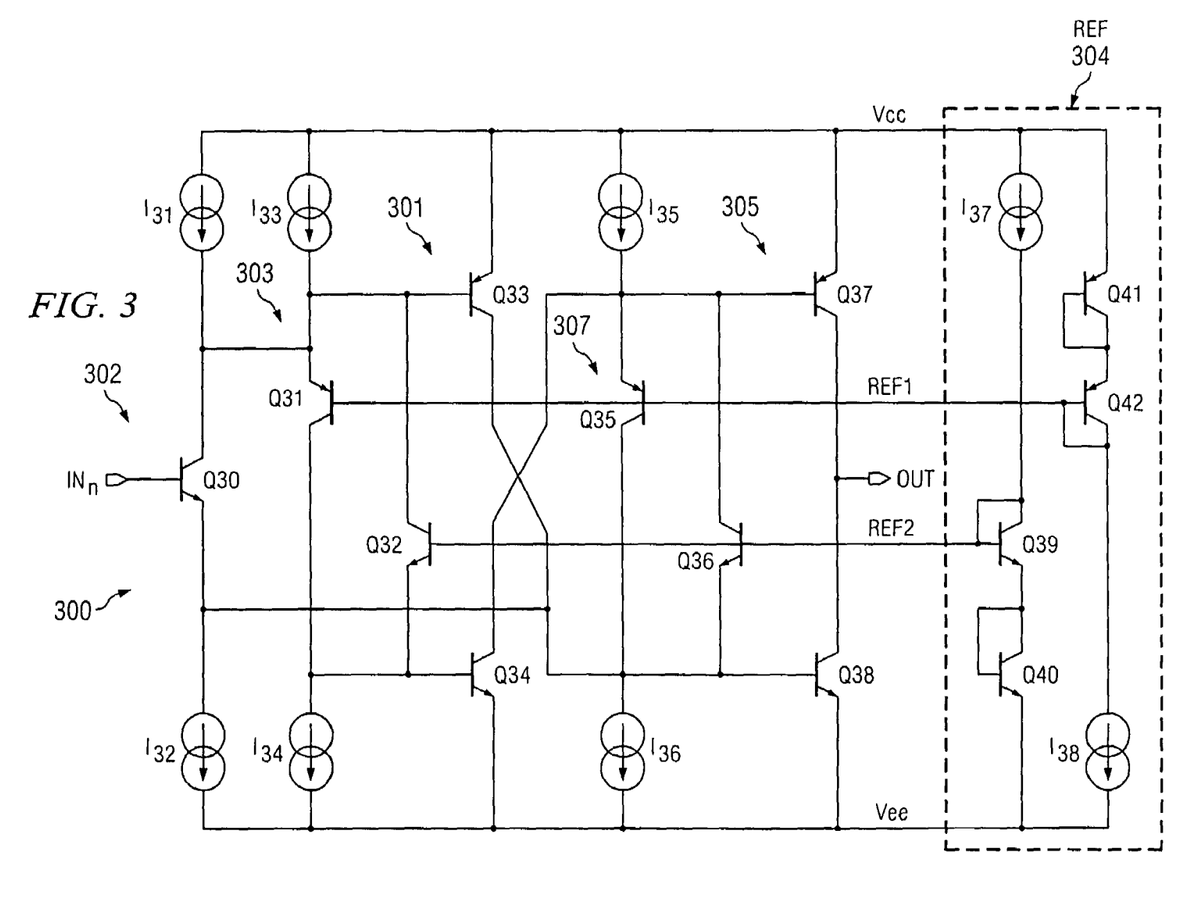
FIG. 3 is a schematic diagram of a bipolar rail-to-rail class-AB output stage according to the present invention.

FIG. 3 depicts an illustrative embodiment of a bipolar rail-to-rail class-AB output stage 300, in accordance with the present invention. In the illustrated embodiment, the bipolar output stage 300 comprises an input buffer stage 302, first and second complementary common emitter stages 301 and 305, and a reference voltage generator REF 304. Specifically, the input buffer stage 302 includes an NPN-type transistor Q30, and current sources I31–I32. The current source I31 is coupled between the collector of the transistor Q30 and the positive power supply voltage Vcc, and the current source I32 is coupled between the emitter of the transistor Q30 and the negative power supply voltage Vee. The complementary common emitter stage 301 includes a PNP-type transistor Q33 and an NPN-type transistor Q34. The bipolar output stage 300 further comprises a first control circuit 303 operative to assure class-AB operation of the complementary common emitter stage 301. The AB-control circuit 303 includes a PNP-type transistor Q31, an NPN-type transistor Q32, and current sources I33–I34. The complementary common emitter stage 305 includes a PNP-type transistor Q37 and an NPN-type transistor Q38. The bipolar output stage 300 further comprises a second control circuit 307 operative to assure class-AB operation of the complementary common emitter stage 305. The AB-control circuit 307 includes a PNP-type transistor Q35, an NPN-type transistor Q36, and current sources I35–I36. The reference voltage generator REF 304 includes diode-connected transistors Q39–Q42, and current sources I37–I38.

As shown in FIG. 3, the input INn of the bipolar output stage 300 is applied to the base of the transistor Q30 included in the input buffer stage 302, and the output OUT is provided at the collectors of the transistors Q37–Q38 included in the complementary common emitter stage 305. Further, the reference voltage generator REF 304 provides a reference voltage REF1 to the bases of the transistors Q31 and Q35, and a reference voltage REF2 to the bases of the transistors Q32 and Q36. The reference voltages REF1–REF2 have values equal to about Vcc−2*Vbe and Vee+2*Vbe, respectively, in which "Vbe" corresponds to the base-to-emitter voltages of the transistors Q39–Q42. The reference voltage generator 304 and the current sources I33–I34 are operative to bias the AB-control circuit 303, and the reference voltage generator 304 and the current sources I35–I36 are operative to bias the AB-control circuit 307.

In the presently disclosed embodiment, the bipolar rail-to-rail class-AB output stage 300 is implemented on a bipolar integrated circuit (IC). Specifically, the transistors Q30, Q32, Q34, Q36, Q38, and Q39–Q40 comprise respective NPN-type bipolar junction transistors (BJTs), and the transistors Q31, Q33, Q35, Q37, and Q41–Q42 comprise respective PNP-type BJTs. Further, the current sources I31–I38 are implemented using the same bipolar IC technology as the BJTs Q30–Q42. It is understood, however, that the various components of the bipolar output stage 300 may be implemented using any suitable IC technology. Alternatively, the transistors Q31–Q42 and the current sources I31–I38 may be implemented with suitable discrete components.

It should be appreciated that the signal path within the bipolar output stage 300 is relatively short. Specifically, the signal path extends from the base of the transistor Q30 included in the input buffer stage 302, through the base-emitter junction of the transistor Q30, and to the base of the transistor Q38 included in the complementary common emitter stage 305. The signal path further extends to the base of the transistor Q37 via the transistors Q35–Q36, which operate like complementary common base stages. It is noted that the combination of the transistors Q30 and Q38 operates like a Darlington common emitter stage.

It is further appreciated that combination of the complementary common emitter stage 301 and the AB-control circuit 303 operates as a current booster stage for the complementary common emitter stage 305. Specifically, the collector of the transistor Q30 of the input buffer stage 302 drives the base of the transistor Q33 directly, and drives the base of the transistor Q34 via the transistors Q31–Q32, which operate like complementary common base stages. In turn, the transistor Q33 drives the base of the transistor Q38, and the transistor Q34 drives the base of the transistor Q37.

As a result, the total current gain for sinking current at the output OUT may be expressed as $$\beta_{SINK} = \beta_{Q30} * \beta_{Q33} * \beta_{Q38} \qquad (1)$$

in which "$\beta_{Q30}$" is the current gain of the NPN transistor Q30, "$\beta_{Q33}$" is the current gain of the PNP transistor Q33, and "$\beta_{Q38}$" is the current gain of the NPN transistor Q38. Further, the total current gain for sourcing current at the output OUT may be expressed as $$\beta_{SOURCE} = \beta_{Q30} * \beta_{Q34} * \beta_{Q37}, \qquad (2)$$

in which "$\beta_{Q30}$" is the current gain of the NPN transistor Q30, "$\beta_{Q34}$" is the current gain of the NPN transistor Q34, and "$\beta_{Q37}$" is the current gain of the PNP transistor Q37. In the preferred embodiment, the total current gains for sinking current $\beta_{SINK}$ and for sourcing current $\beta_{SOURCE}$ are substantially the same.

Figure 4:
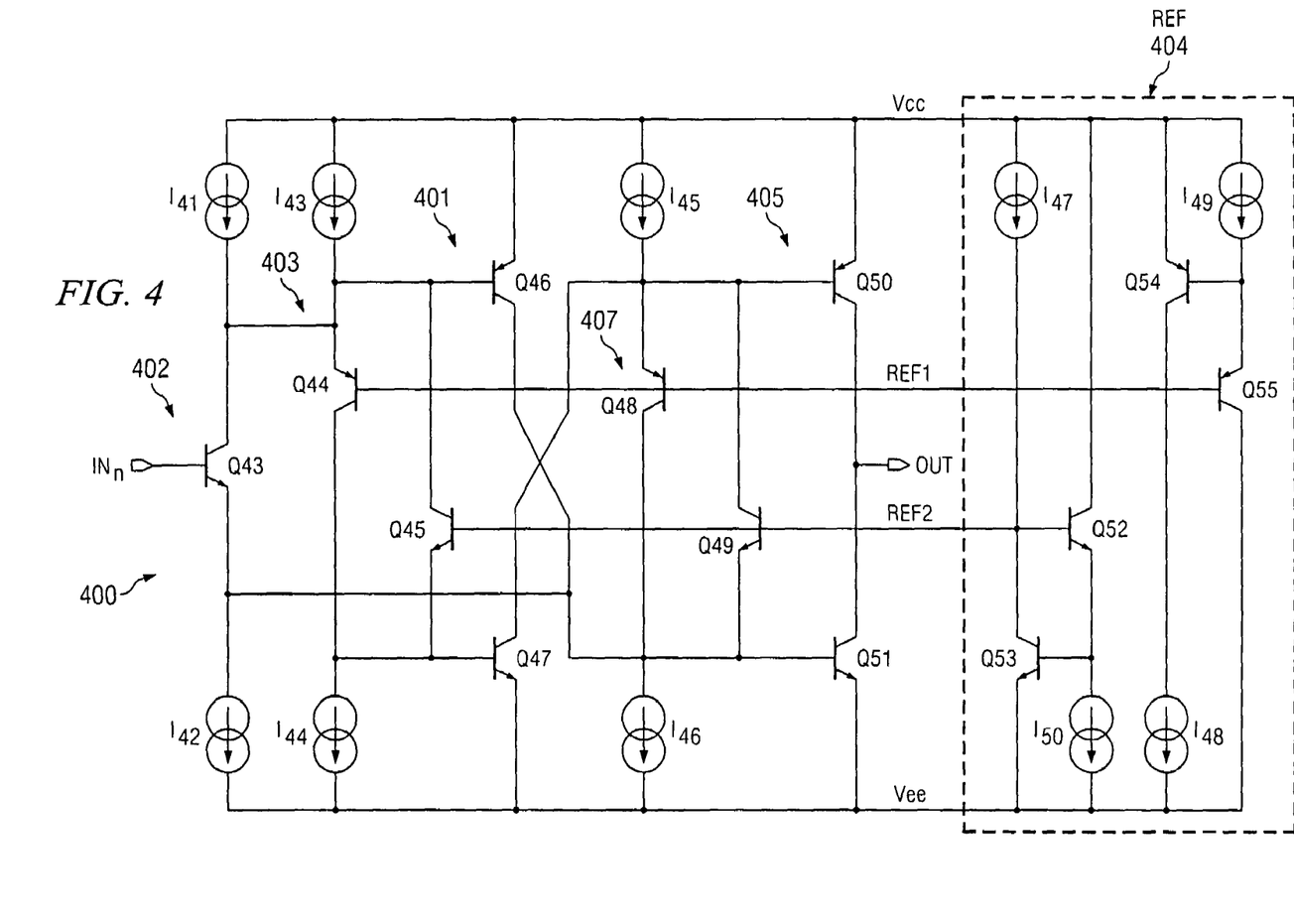
FIG. 4 is a schematic diagram of a first alternative embodiment of the bipolar rail-to-rail class-AB output stage of FIG. 3.

FIG. 4 depicts a first alternative embodiment 400 of the bipolar rail-to-rail class-AB output stage 300 (see FIG. 3). In the illustrated embodiment, the bipolar output stage 400 comprises an input buffer stage 402, first and second complementary common emitter stages 401 and 405, and a reference voltage generator REF 404. Specifically, the input buffer stage 402 includes an NPN-type transistor Q43, and current sources I41–I42. The complementary common emitter stage 401 includes a PNP-type transistor Q46 and an NPN-type transistor Q47. The bipolar output stage 400 further comprises a first control circuit 403 operative to assure class-AB operation of the complementary common emitter stage 401. The AB-control circuit 403 includes a PNP-type transistor Q44, an NPN-type transistor Q45, and current sources I43–I44. The complementary common emitter stage 405 includes a PNP-type transistor Q50 and an NPN-type transistor Q51. The bipolar output stage 400 further comprises a second control circuit 407 operative to assure class-AB operation of the complementary common emitter stage 405. The AB-control circuit 407 includes a PNP-type transistor Q48, an NPN-type transistor Q49, and current sources I45–I46. The input INn of the bipolar output stage 400 is applied to the base of the transistor Q43 included in the input buffer stage 402, and the output OUT is provided at the collectors of the transistors Q50–Q51 included in the complementary common emitter stage 405.

As shown in FIG. 4, the reference voltage generator REF 404 includes NPN-type transistors Q52–Q53, PNP-type transistors Q54–Q55, and current sources I47–I50. The reference voltage generator REF 404 provides a reference voltage REF1 to the bases of the transistors Q44 and Q48, and a reference voltage REF2 to the bases of the transistors Q45 and Q49. Like the reference voltages generated by the reference voltage generator REF 304, the reference voltages REF1–REF2 generated by the reference voltage generator REF 404 have values equal to about Vcc−2*Vbe and Vee+2*Vbe, respectively, in which "Vbe" corresponds to the base-to-emitter voltages of the transistors Q52–Q55. Specifically, the NPN transistors Q52–Q53 and the current I47 and I50 are configured to generate the voltage Vee+2*Vbe (i.e., REF1), and the PNP transistors Q54–Q55 and the current sources I48 and I49 are configured to generate the voltage Vcc−2*Vbe (i.e., REF2).

It is noted that the separate current sources I41 and I43 coupled between the collector of the transistor Q43 and the positive power supply voltage Vcc may alternatively be implemented as a single current source. Similarly, the separate current sources I42 and I46 coupled between the emitter of the transistor Q43 and the negative power supply voltage Vee may alternatively be implemented as a single current source.

Figure 5:
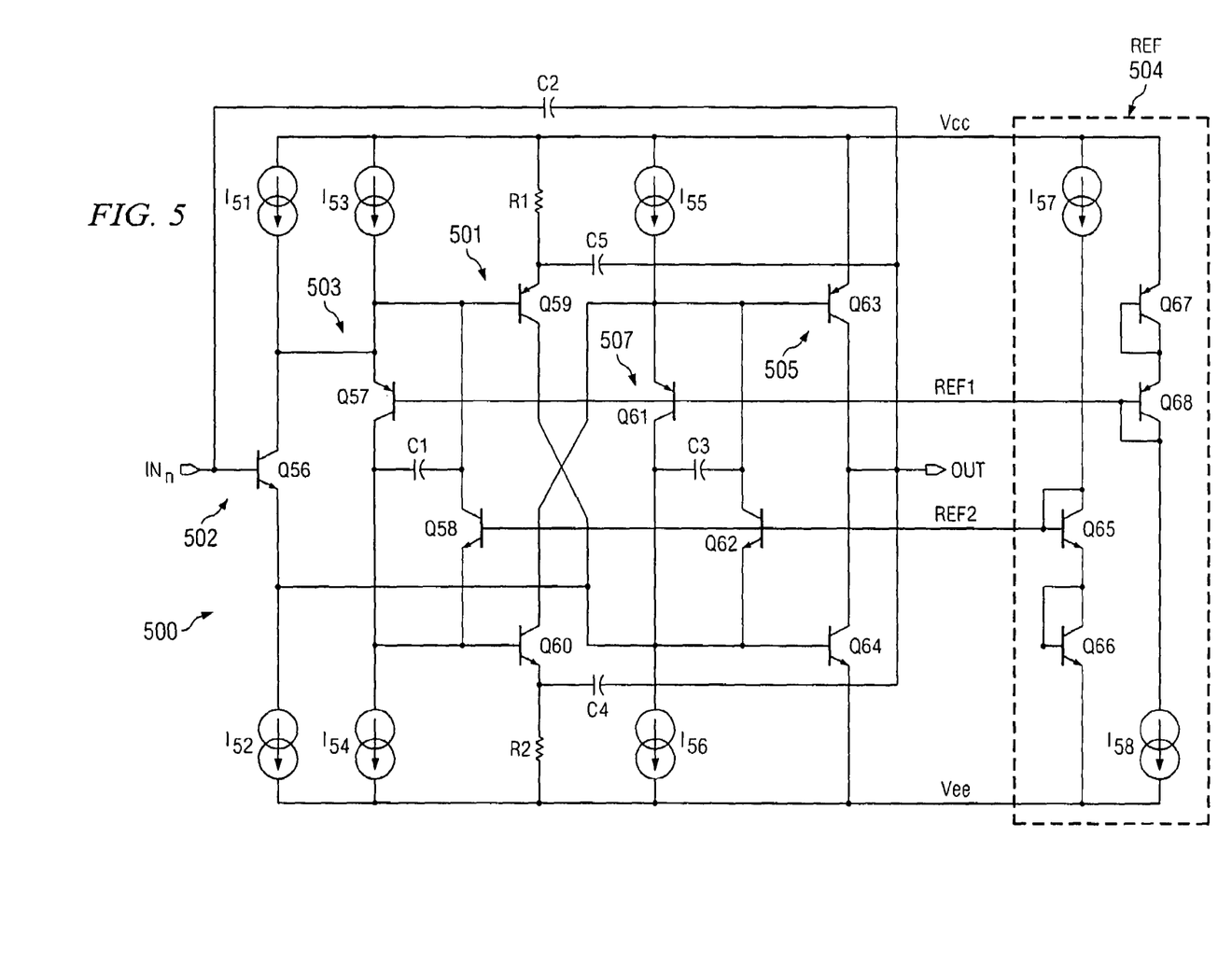
FIG. 5 is a schematic diagram of a second alternative embodiment of the bipolar rail-to-rail class-AB output stage of FIG. 3.

FIG. 5 depicts a second alternative embodiment 500 of the bipolar rail-to-rail class-AB output stage 300 (see FIG. 3). In the illustrated embodiment, the bipolar output stage 500 comprises an input buffer stage 502, first and second complementary common emitter stages 501 and 505, and a reference voltage generator REF 504. Specifically, the input buffer stage 502 includes an NPN-type transistor Q56 and current sources I51–I52. The complementary common emitter stage 501 includes transistors Q59–Q60. The bipolar output stage 500 further comprises a first control circuit 503 operative to assure class-AB operation of the complementary common emitter stage 501. The AB-control circuit 503 includes a PNP-type transistor Q57, an NPN-type transistor Q58, and current sources I53–I54. The complementary common emitter stage 505 includes a PNP-type transistor Q63 and an NPN-type transistor Q64. The bipolar output stage 500 further comprises a second control circuit 507 operative to assure class-AB operation of the complementary common emitter stage 505. The AB-control circuit 507 includes a PNP-type transistor Q61, an NPN-type transistor Q62, and current sources I55–I56. The input INn of the bipolar output stage 500 is applied to the base of the transistor Q56 included in the input buffer stage 502, and the output OUT is provided at the collectors of the transistors Q63–Q64 included in the complementary common emitter stage 505. The reference voltage generator REF 504, which includes diode-connected transistors Q65–Q68 and current sources I57–I58, provides a reference voltage REF1 to the bases of the transistors Q57 and Q61 and a reference voltage REF2 to the bases of the transistors Q58 and Q62.

As shown in FIG. 5, the bipolar output buffer 500 further includes capacitors C1–C5 and degeneration resistors R1–R2, which are configured and arranged for frequency compensation and/or current limiting purposes. Specifically, the resistor R1 is coupled between the emitter of the transistor Q59 and the positive power supply voltage Vcc, and the resistor R2 is coupled between the emitter of the transistor Q60 and the negative power supply voltage Vee. The capacitor C2 is coupled between the input INn and the output OUT of the output buffer 500 and operates as a Miller capacitor. The capacitors C4–C5 are coupled between the output OUT and the emitters of the transistors Q60 and Q59, respectively, for compensating the current booster stage formed by the complementary common emitter stage 501 and the AB-control circuit 503. The capacitor C1 is coupled between the emitters and collectors of the transistors Q57–Q58, and the capacitor C3 is coupled between the emitters and collectors of the transistors Q61–Q62, for providing feed-forward compensation to bypass the respective complementary common base stages formed by these transistors.

It is noted that during high frequency operation of the bipolar output stage 500, the capacitors C1 and C3 are approximately short circuits. As a result, the emitter of the transistor Q56 is substantially connected directly to the bases of the transistors Q63–Q64 at high frequency, thereby causing the bipolar output stage 500 to behave like a Darlington common emitter stage. Moreover, the collector of the transistor Q56 is substantially connected directly to the bases of the transistors Q59 and Q60 at high frequency, thereby causing the total current gains for sinking and sourcing current at the output OUT to be approximately the same. It is understood that the configuration and arrangement of the components C1–C5 and R1–R2 are disclosed herein for purposes of illustration, and that alternative configurations and arrangements of components may be employed to achieve desired frequency compensation and current limiting characteristics.

Figure 6:
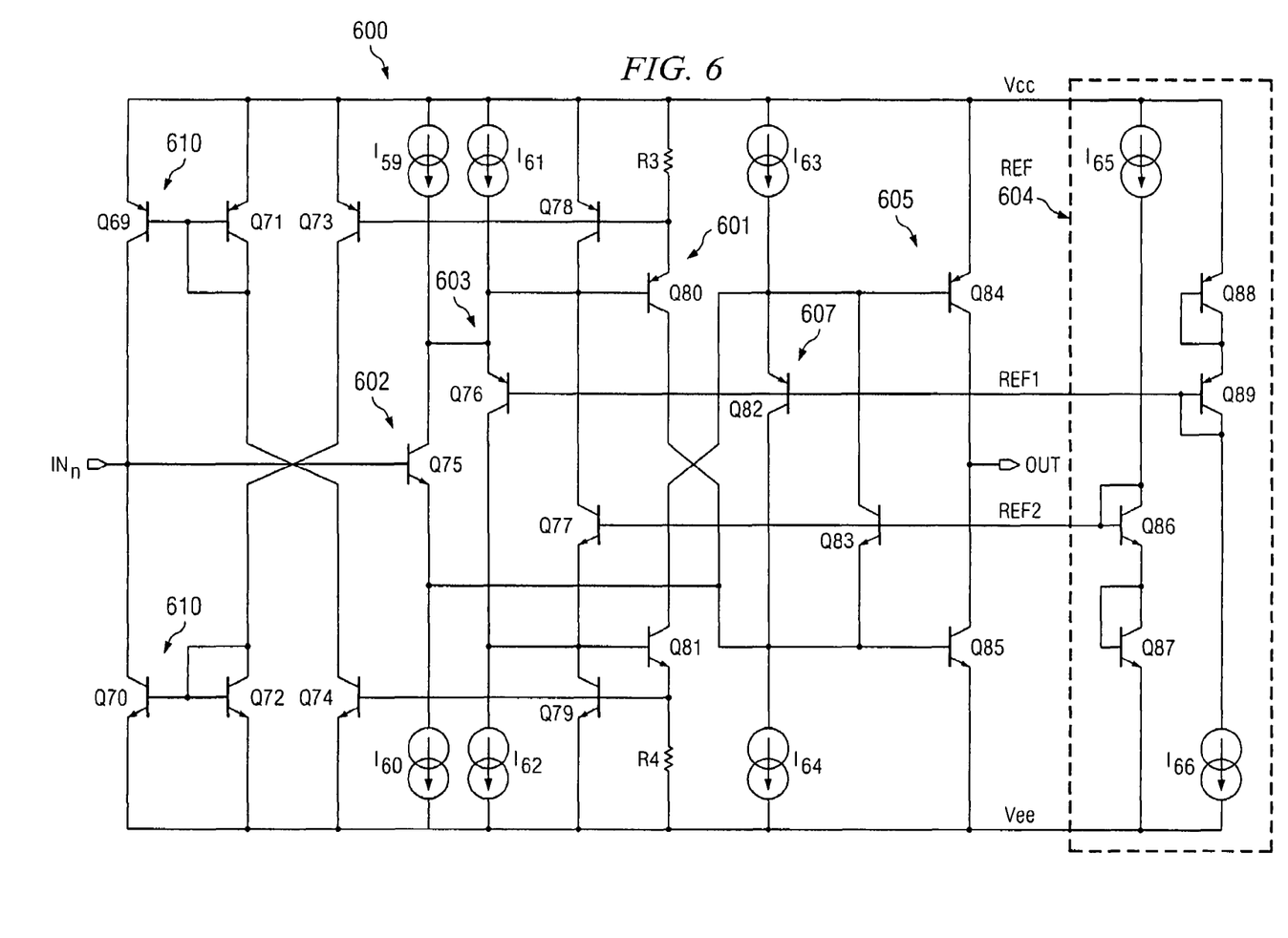
FIG. 6 is a schematic diagram of a third alternative embodiment of the bipolar rail-to-rail class-AB output stage of FIG. 3.

FIG. 6 depicts a third alternative embodiment 600 of the bipolar rail-to-rail class-AB output stage 300 (see FIG. 3). In the illustrated embodiment, the bipolar output stage 600 comprises an input buffer stage 602, first and second complementary common emitter stages 601 and 605, and a reference voltage generator REF 604. Specifically, the input buffer stage 602 includes an NPN-type transistor Q75 and current sources I59–I60. The complementary common emitter stage 601 includes transistors Q80–Q81 and degeneration resistors R3–R4. The bipolar output stage 600 further comprises a first control circuit 603 operative to assure class-AB operation of the complementary common emitter stage 601. The AB-control circuit 603 includes a PNP-type transistor Q76, an NPN-type transistor Q77, and current sources I61–I62. The complementary common emitter stage 605 includes a PNP-type transistor Q84 and an NPN-type transistor Q85. The bipolar output stage 600 further comprises a second control circuit 607 operative to assure class-AB operation of the complementary common emitter stage 605. The AB-control circuit 607 includes a PNP-type transistor Q82, an NPN-type transistor Q83, and current sources I63–I64. The input INn of the bipolar output stage 600 is applied to the base of the transistor Q75 included in the input buffer stage 602, and the output OUT is provided at the collectors of the transistors Q84–Q85 included in the complementary common emitter stage 605. The reference voltage generator REF 604, which includes diode-connected transistors Q86–Q89 and current sources I65–I66, provides a reference voltage REF1 to the bases of the transistors Q76 and Q82 and a reference voltage REF2 to the bases of the transistors Q77 and Q83.

As shown in FIG. 6, the bipolar output buffer 600 includes a PNP-type transistor Q78 and an NPN-type transistor Q79. The base and collector of the transistor Q78 are connected to the emitter and base of the transistor Q80, respectively, and the base and collector of the transistor Q79 are connected to the emitter and base of the transistor Q81, respectively. The emitter of the transistor Q78 is coupled to the positive power supply voltage Vcc, and the emitter of the transistor Q79 is coupled to the negative power supply voltage Vee. The transistor Q78 is configured to limit the base current of the transistor Q80, thereby limiting the base current of the output transistor Q84. Similarly, the transistor Q79 is configured to limit the base current of the transistor Q81, thereby limiting the base current of the output transistor Q85.

The bipolar output buffer 600 further comprises a PNP-type transistor Q73, an NPN-type transistor Q74, a first current mirror 612 including a diode-connected input transistor Q72 and an output transistor Q70, and a second current mirror 610 including a diode-connected input transistor Q71 and an output transistor Q69. The transistors Q73–Q74 are configured to limit the voltage swing of the input INn, and to limit the current flowing through the transistor Q75 of the input buffer stage 602. It is noted that the respective output transistors Q70 and Q69 of the current mirrors 612 and 610 are connected to the input INn of the output stage 600. Further, the collector currents of the transistors Q73–Q74 are inverted and scaled by the respective current mirrors 610 and 612. In effect, the transistors Q73–Q74 form a local clamping feedback loop, which lowers gain when the output OUT is clipped or in a current-limit mode.

It will be appreciated by those of ordinary skill in the art that further modifications to and variations of the above-described bipolar rail-to-rail output stage may be made without departing from the inventive concepts disclosed herein. Accordingly, the invention should not be viewed as limited except as by the scope and spirit of the appended claims.

What is claimed is:
1. A circuit, comprising:
 an input node and an output node;
 first and second supply nodes;
 an input stage including a first transistor coupled between the first and second supply nodes, the first transistor having a base connected to the input node;
 a current booster stage including a first complementary common emitter stage and a first AB control circuit operatively coupled to the first common emitter stage, the first common emitter stage and the first AB control circuit being coupled between the first and second supply nodes, respectively; and an output stage including a second complementary common emitter stage and a second AB control circuit operatively coupled to the second common emitter stage, the second common emitter stage and the second AB-control circuit being coupled between the first and second supply nodes, respectively, the second common emitter stage including second and third transistors having respective bases and collectors, the collectors of the second and third transistors being connected to the output node, wherein the first common emitter stage includes fourth and fifth transistors having respective collectors connected to the bases of the second and third transistors, respectively, wherein the first transistor has an emitter connected to the base of at least one of the second and third transistors, and wherein the first transistor further has a collector, and further including a first current source coupled between the first supply node and the collector of the first transistor, and a second current source coupled between the second supply node and the emitter of the first transistor.

2. The circuit of claim 1 further including a reference voltage generator configured to provide first and second reference voltages to the first and second AB control circuits for biasing the first and second AB-control circuits.

3. The circuit of claim 2 wherein the first AB-control circuit includes sixth and seventh transistors having respective bases, the sixth and seventh transistors being coupled between the first and second supply nodes in respective common base configurations, wherein the second AS-control circuit includes eighth and ninth transistors having respective bases, the eighth and ninth transistors being coupled between the first and second supply nodes in respective common base configurations, and wherein the reference voltage generator is configured to provide the first reference voltage to the bases of the sixth and eighth transistors, and to provide the second reference voltage to the bases of the seventh and ninth transistors.

4. The circuit of claim 3 wherein Vcc is a first supply voltage provided at the first supply node, wherein Vee is a second supply voltage provided at the second supply node, wherein the first reference voltage equals about Vcc−2*Vbe, and wherein the second reference voltage equals about Vee+2*Vbe, Vbe being equal to a base to-emitter voltage.

5. The circuit of claim 1 further including a third current source coupled between the first supply node and the first AB control circuit and a fourth current source coupled between the second supply node and the first AB-control circuit, the third and fourth current sources being configured to bias the first AS-control circuit.

6. The circuit of claim 1 further including a third current source coupled between the first supply node and the second AB control circuit and a fourth current source coupled between the second supply node and the second AB-control circuit, the third and fourth current sources being configured to bias the second AB-control circuit.

7. The circuit of claim 1 wherein the fourth and fifth transistors further have respective bases, and the first transistor further has a collector connected to the base of at least one of the fourth and fifth transistors.

8. The circuit of claim 2 wherein the reference voltage generator includes serially connected first and second NPN diode-connected transistors, serially connected first and second PNP diode-connected transistors, a seventh current source coupled between the first supply node and the first and second NPN transistors, and an eighth current source coupled between the second supply node and the first and second PNP transistors, wherein the first and second PNP transistors and the eighth current source are configured to provide the first reference voltage, and wherein the first and second NPN transistors and the seventh current source are configured to provide the second reference voltage.

9. The circuit of claim 1 further including a first emitter degeneration resistor coupled between the first supply node and an emitter of the fourth transistor, and a second emitter degeneration resistor coupled between the second supply node and an emitter of the fifth transistor.

10. The circuit of claim 9 further including a first capacitor coupled between the input and output nodes, a second capacitor coupled between the output node and the emitter of the fifth transistor, and a third capacitor coupled between the output node and the emitter of the fourth transistor, for providing frequency compensation.

11. The circuit of claim 10 wherein the first AB control circuit includes sixth and seventh transistors, the sixth and seventh transistors being coupled between the first and second supply nodes in respective common base configurations, wherein the second AB control circuit includes eighth and ninth transistors, the eighth and ninth transistors being coupled between the first and second supply nodes in respective common base configurations, and further including a fourth capacitor coupled between the sixth and seventh transistors to provide feed forward compensation, and a fifth capacitor coupled between the eighth and ninth transistors to provide feed-forward compensation.

12. The circuit of claim 1 further including a sixth transistor having a base connected to an emitter of the fourth transistor, an emitter connected to the first supply node, and a collector connected to a base of the fourth transistor, the sixth transistor being biased to limit a current through the fourth transistor, and further including a seventh transistor having a base connected to an emitter of the fifth transistor, an emitter connected to the second supply node, and a collector connected to a base of the fifth transistor, the seventh transistor being biased to limit a current through the fifth transistor.

13. The circuit of claim 1 further including a first current mirror having an input transistor and an output transistor, a second current mirror having an input transistor and an output transistor, and sixth and seventh transistors, the output transistor of the first current mirror being coupled between the first supply node and the input node, the output transistor of the second current mirror being coupled between the second supply node and the input node, the input transistor of the first current mirror being coupled between the first supply node and a collector of the seventh transistor, and the input transistor of the second current mirror being coupled between the second supply node and a collector of the sixth transistor.

14. The circuit of claim 13 wherein the sixth transistor further has an emitter connected to the first supply node, and a base connected to an emitter of the fourth transistor, and the seventh transistor further has an emitter connected to the second supply node, and a base connected to an emitter of the fifth transistor, and wherein the first and second current mirrors and the sixth and seventh transistors are configured to form a local clamping feedback loop for lowering gain when an output signal provided at the output node is clipped or in a current limit mode.

* * * * *